(12) United States Patent
Hurd

(10) Patent No.: US 6,979,999 B2
(45) Date of Patent: Dec. 27, 2005

(54) METHOD AND SYSTEM OF MAPPING OXYGEN CONCENTRATION ACROSS A REGION-OF-INTEREST

(75) Inventor: Ralph E. Hurd, Milpitas, CA (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/708,356

(22) Filed: Feb. 26, 2004

(65) Prior Publication Data

US 2005/0189941 A1 Sep. 1, 2005

(51) Int. Cl.[7] .............................................. G01V 3/00
(52) U.S. Cl. ...................................... 324/300; 324/307
(58) Field of Search ................................ 324/300, 307, 324/309, 312, 314, 316, 318, 319

(56) References Cited

U.S. PATENT DOCUMENTS

| | | | |
|---|---|---|---|
| 6,528,997 B2 * | 3/2003 | Zhong et al. ............... | 324/307 |
| 2003/0160610 A1 | 8/2003 | Van Zijl et al. | |

FOREIGN PATENT DOCUMENTS

| | | |
|---|---|---|
| WO | WO 03/049604 A2 | 6/2003 |
| WO | WO 03/050521 A1 | 6/2003 |

OTHER PUBLICATIONS

Kreutzer et al., "[1] H-nuclear magnetic resonance deoxymyoglobin signal as indicator of intracellular oxygenation in myocardium," *Am J Physiol.* (1991), p. H2091-97, 0363-6135/91.

Kreutzer et al., "Observing the Deoxy Hemoglobin Signal in Human Muscle as an Index of Vascular $pO_2$," *Proc. Int. Soc. Magn. Reson. Med.* 77 (1998).

Lukin et al., "Quaternary structure of hemoglobin in solution," PNAS (2003), p. 517-520, vol. 100, No. 2, available at www.pnas.org/cgi/doi/10.1073/pnas.232715799.

Mihailescu et al., "A signature of the T→R transition in human hemoglobin." PNAS (2001), p. 3773-3777, vol. 98, No. 7, available at www.pnas.org/cgi/doi/10.1073/pnas.071493598.

Mole et al., "Myoglobin desaturation with exercise intensity in human gastrocnemius muscle,"*Am J Physiol*(1999), p. R173-80, 0363-6119/99.

Simplaceanu et al., "Chain-Selective Isotopic Labeling for NMR Studies of Large Multimeric Proteins: Application to Hemoglobin." *Biophysical Journal* (2000), p. 1146-1154, vol. 79(2).

Tran et al., "Comparative analysis of NMR and NIRS measurements of intracellular $PO_2$ in human skeletal muscle." *Am J Physiol* (1999), p. R1682-1690, 0363-6119/99.

Tran et al., "Spatial distribution of deoxymyoglobin in human muscle: an index of local tissue oxygenation." *NMR Biomed.* (1999;12:26-30), John Wiley & Sons, Ltd.

Zhou et al., "Amide Proton Transfer Contrast for Imaging of Brain Tumors," *Proc. ISMRM* 11 (2003), p. 42.

(Continued)

*Primary Examiner*—Brij B. Shrivastav
(74) *Attorney, Agent, or Firm*—Ziolkowski Patent Solutions Group, SC; Michael A. Della Penna; Carl B. Horton

(57) ABSTRACT

A system and method for imaging is presented that includes exciting water-exchangeable spins in oxygen-bearable molecules in a ROI having a change in oxygen status. A proton transfer within the ROI from exchangeable protons within water is detected such that changes in oxygen levels across the ROI are distinguishable.

28 Claims, 2 Drawing Sheets

OTHER PUBLICATIONS

Zhou et al., "Using the amide proton signals of intracellular proteins and peptides to detect pH effects in MRI," *Nature Medicine* (2003), p. 1085-90, vol. 9, No. 8.

Jue, T., "Measuring Tissue Oxygenation with the $^1$H NMR Signals of Myoglobin", *NMR in Physiology and Biomedicine*, 1991, pp. 199-207.

* cited by examiner

METHOD AND SYSTEM OF MAPPING OXYGEN CONCENTRATION ACROSS A REGION-OF-INTEREST

BACKGROUND OF INVENTION

The present invention relates generally to a method of magnetic resonance (MR) imaging and, more particularly, to mapping changes in oxygen level in vivo. The present invention further relates to a method of MRI, and MR spectroscopy for determining oxygenation of heme-proteins in vivo. In vivo oxygen is present primarily in the form of oxy-hemoglobin and oxy-myoglobin. Detection of hemoglobin and myoglobin in the deoxy state can be used to determine oxygen debt and by calculation, $pO_2$ levels may be determined. Deoxy-myoglobin and deoxy-hemoglobin both have unique hyperfine shifted signals over 70 ppm downfield from the water signal which can be used to distinguish them from their oxy counterparts.

When a substance such as human tissue is subjected to a uniform magnetic field (polarizing field B0), the individual magnetic moments of the spins in the tissue attempt to align with this polarizing field, but precess about it in random order at their characteristic Larmor frequency. If the substance, or tissue, is subjected to a magnetic field (excitation field B1) which is in the x-y plane and which is near the Larmor frequency, the net aligned moment, or "longitudinal magnetization", MZ, may be rotated, or "tipped", into the x-y plane to produce a net transverse magnetic moment Mt. A signal is emitted by the excited spins after the excitation signal B1 is terminated and this signal may be received and processed to form an image.

When utilizing these signals to produce images, magnetic field gradients (Gx, Gy, and Gz) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Typically, MR imaging protocols utilize water content within the subject and properties thereof to develop contrast and thereby image specific regions of the subject. Specifically, conventional MR imaging techniques rely on the relaxation properties of hydrogen atoms of water to provide a means whereby contrast is obtained in the reconstructed image. As such, conventional MR images of tissues employ a combination of spin-lattice (T1) and spin—spin (T2) water relaxation to generate image contrast between tissues.

The imaging techniques we have discussed so far detect signals from "mobile molecules" having "mobile protons." That is, "direct" MR imaging techniques are predicated upon the "mobile molecules" having "mobile protons," which have a relatively long T2 relaxation period such that encoding gradients can be established between initial excitation and acquisition for data acquisition before the relaxation signal has decayed to an undetectable state.

However, these techniques are less adapt at imaging "immobile" or "less-mobile molecules" that have "less-mobile protons" with reduced T2 properties, e.g. T2 periods of less than one millisecond (ms). As result, these immobile, or slow moving, molecules contained in macromolecules, cannot be directly imaged. As such, MR imaging techniques have been developed to take advantage of coupling between the immobile protons and the mobile protons of water to allow imaging of these less mobile molecules.

Specifically, the mobile and immobile protons exist in slightly different magnetic environments and, therefore, each can be separately excited. By selectively exciting the immobile protons contained in the macromolecules with a narrow-band RF pulse, magnetization exchange can be induced between the immobile protons and the mobile protons in free water. That is, it is possible to saturate the spins of the immobile protons, which have a much broader absorption lineshape than the spins of the mobile protons, thereby causing the spins of the immobile protons to be transferred to the mobile protons. As such, the non-directly imageable immobile molecules become imageable in accordance with MR imaging technology by observing the interaction of mobile protons in free water molecules. Simply, since the spin state of the immobile protons can be excited to influence the spin state of the mobile protons, these non-directly imageable molecules can be imaged indirectly as a result of their influence on imageable molecules. This process is typically referred to as magnetization transfer (MT) imaging.

Chemical shift can also be used to distinguish chemicals beyond the dominant water signal. Chemical shift data can be collected as single volume elements or as images. Unlike oxy-hemoglobin and oxy-myoglobin, both deoxy-hemoglobin and deoxy-myoglobin have signals well resolved from the dominant water signal (over 70 ppm), and can be directly detected. Unfortunately, low concentrations of these signals, translates into low resolution imaging or single volume detection methods.

It has recently been demonstrated that protons in exchange with water can be detected with amplification by imaging the change in water signal after selective presaturation of the water exchangeable signal. A potentially confounding factor in utilizing these imaging techniques is the so-called MT effect. That is, bound water signals in magnetic exchange with water can overlap the discrete chemical shifts that are the basis of our invention. However, this is not an issue for detecting relative changes in oxygen level with stress or activation, but require additional measurements for absolute concentration images.

Although direct detection of deoxy-myoglobin and deoxy-hemoglobin provide accurate measure of oxygen debt, an amplified response, even at less quantifiable levels, would be desirable. It would therefore be desirable to have a system and method capable of providing images with sufficient sensitivity to imagedeoxy-hemoglobin and deoxy-myoglobin.

BRIEF DESCRIPTION OF INVENTION

The present invention provides a system and method of determining changes in oxygenation concentration across a ROI that overcomes the aforementioned drawbacks. Specifically, the present invention provides a system and method of medical imaging for sensitive and localized mapping of oxygen concentration in an ROI by detecting deoxy-hemoglobin and deoxy-myoglobin presence in the ROI.

In accordance with one aspect of the invention, a method of clinical imaging is disclosed that includes exciting water-exchangeable spins in oxygen-bearable molecules in a ROI having a change in oxygen status. The method includes detecting proton transfer within the ROI from exchangeable protons within water and determining changes in oxygen levels across the ROI.

According to another aspect of the invention, a method of determining oxygenation of heme-proteins in vivo is disclosed that includes applying radio frequency (RF) energy to an imaging subject to excite off-resonance spins of water-exchangeable molecules and determining proton transfer from excited water-exchangeable molecules to non-excited molecules. The method also includes acquiring MR data from the non-excited molecules and determining an oxygen content of the water-exchangeable molecules from the MR data.

In accordance with another aspect, the invention includes a MRI apparatus including a MRI system having a plurality of gradient coils positioned about a bore of a magnet to impress a polarizing magnetic field and an RF transceiver system and an RF switch controlled by a pulse module to transmit RF signals to an RF coil assembly to acquire MR images. The MRI apparatus also includes a computer programmed to cause application of a pulse sequence to excite oxygen-bearable molecules within a ROI having a change in oxygenation, acquire MR data from directly imageable molecules having been influenced by the oxygen-bearable molecules, and reconstruct an image from the MR data to illustrate a change in oxygen debt across the ROI.

In accordance with yet another aspect of the invention, a system of oxygen content determination is disclosed that includes means for exciting spins limited to targeted oxygen-carrier molecules, means for determining a proton transfer from oxygen-carrier molecules to imageable molecules, and means for determining an oxygenation of the oxygen-carrier molecules from a reconstructed image of the imageable molecules.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
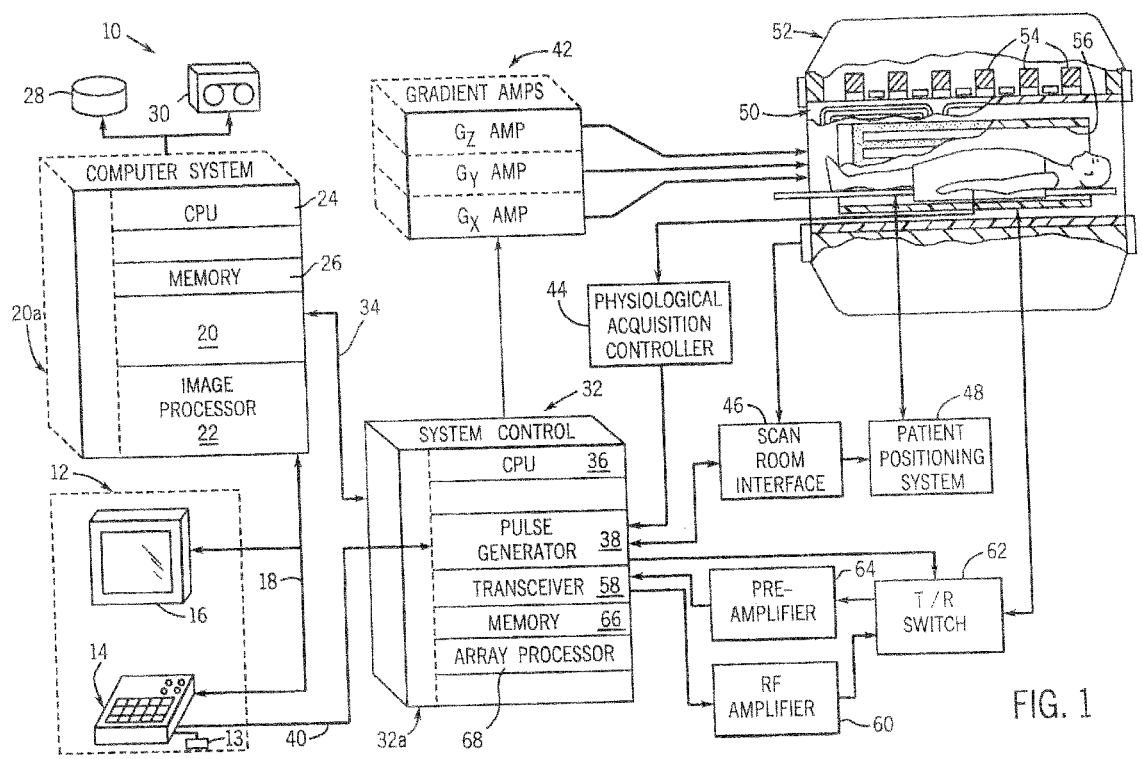
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a central processing unit (CPU) module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the radio frequency (RF) pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as electrocardiogram (ECG) signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The heretofore described apparatus may be used to acquire MR data to facilitate the determination of oxygenation of heme-proteins across a region-of-interest (ROI) by developing contrast between deoxy-hemoglobin and deoxy-myoglobin and surrounding tissues, proteins and the like. Specifically, as will be described in detail, an MR apparatus is utilized to excite spins in non-directly imageable molecules within an ROI, detect proton transfer from the non-imageable molecules to directly imageable molecules within to the ROI, and determine oxygen concentration across the ROI therefrom.

Figure 2:
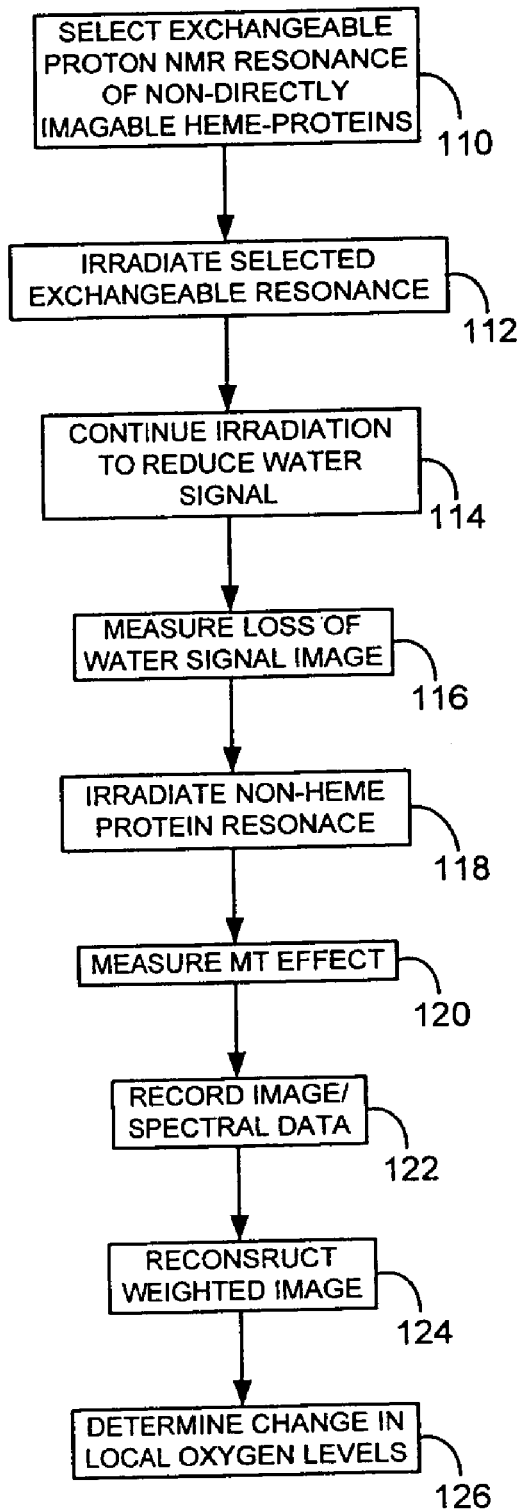
FIG. 2 is a flowchart setting forth the steps of a technique of determining oxygenation across an ROI in accordance with the present invention.

Referring to FIG. 2, a technique for determining oxygen concentration across an ROI resulting from amide proton transfer between non-directly imageable molecules and imageable water is shown. In a preferred embodiment, the non-directly imageable molecules are deoxy-hemoglobin or deoxy-myoglobin. As will be described, this novel technique utilizes water exchange amplification to image deoxy-hemoglobin or deoxy-myoglobin via exchangeable resonances shifted to a frequency unique to the doxy form or substantially changed in exchange rate relative to the oxy form. Furthermore, the technique utilizes the difference in proton transfer that occurs in hemoglobin or myoglobin when oxygenated as opposed to deoxygenated.

Referring to FIG. 2, an exchangeable proton nuclear magnetic resonance (NMR) of the non-directly imageable heme-proteins is selected 110. For example, in accordance with a preferred embodiment, paramagnetic hyperfine-shifted or off-resonance exchangeable resonances of deoxy-hemoglobin or deoxy-myoglobin are selected. In this case, one preferred target is histidine NH which, in the deoxy-hemoglobin state has three times the water exchange rate of the same resonance in oxy-hemoglobin.

After selection 110, the ROI is irradiated with the selected exchangeable resonance 112. That is, the selected exchangeable resonance is applied to the ROI to excite water-exchangeable spins in heme-proteins, particularly oxygen-bearable or oxygen-carrier molecules. More specifically, the irradiation of heme-protein exchangeable resonance at a level optimized for reduction of a water signal is continued 114. As such, the spin state of the protons of the heme-proteins is excited such that it is transferred to and accepted by imageable molecules, typically imageable water molecules. As such, this process may be referred to as a proton transfer or water transfer effect.

The reduction of the water signal is measured 116 and irradiation of the ROI is repeated at a non-heme protein resonance frequency 118 in order to measure an MT effect 120. The data gathered from the ROI during the irradiations is recorded as a difference water image or spectral data 122. The acquired MR data is then reconstructed to form an image 124 in accordance with well-known image reconstruction techniques. From the reconstructed image 124, it is possible to determine oxygenation changes across the ROI 126. That is, a determination in the change in local oxygen levels is made via the change in water detected deoxy-hemoglobin or deoxy-myoglobin exchange. As such, the imaging technique yields a reconstructed image that illustrates oxygenation debt across the ROI.

To further distinguish these differences in oxygenation, the data may be adjusted or weighted after reconstruction based on oxygenation 124. Therefore, a spatial distribution of oxygen debt across the ROI results and provides enhanced contrast between oxygen depleted and oxygen-rich regions in the ROI.

For example, utilizing an exchangeable proton off-resonance, myoglobin, upon oxygenation, becomes diamagnetic and a signal from the myoglobin is shifted from the frequency of the selective irradiation. It is contemplated that one preferred target is the histidine NH, which in the doxy myoglobin state, is shifted to approximately 75 ppm downfield of water. As such a proton spectrum range is contemplated of approximately 10–80 ppm. Accordingly, upon review of the reconstructed exchangeable proton weighted image 124, it is possible to identify a region experiencing myoglobin oxygen debt because data from the oxygen rich myoglobin is absent in the reconstructed image 126. As such, a direct sensitive measure of oxygen debt or concentration across the ROI may be made, for example, in the brain, muscle tissue, cardiac region, or other anatomical region. That is, the above-described technique provides a relatively direct means for illustrating a spatial distribution of oxygen debt through imaging of molecules influenced by a proton transfer from the otherwise non-imageable molecules or tissues.

Therefore, in accordance with one embodiment aspect of the invention, a method of clinical imaging is disclosed that includes exciting water-exchangeable spins in oxygen-bearable molecules in a ROI having a change in oxygen status. The method includes detecting proton transfer within the ROI from exchangeable protons within water and determining changes in oxygen levels across the ROI.

In accordance with another embodiment of the invention, a method of determining oxygenation of heme-proteins in vivo is disclosed that includes applying radio frequency (RF) energy to an imaging subject to excite off-resonance spins of water-exchangeable molecules and determining proton transfer from excited water-exchangeable molecules to non-excited molecules. The method also includes acquiring MR data from the non-excited molecules and determining an oxygen content of the water-exchangeable molecules from the MR data.

In accordance with another embodiment of the invention, an MRI apparatus is disclosed including a MRI system having a plurality of gradient coils positioned about a bore of a magnet to impress a polarizing magnetic field and an RF transceiver system and an RF switch controlled by a pulse module to transmit RF signals to an RF coil assembly to acquire MR images. The MRI apparatus also includes a computer programmed to cause application of a pulse sequence to excite oxygen bearable molecules within a ROI having a change in oxygenation, acquire MR data from directly imageable molecules having been influenced by the oxygen-bearable molecules, and reconstruct an image from the MR data to illustrate a change in oxygen debt across the ROI.

In accordance with yet another embodiment of the invention, a system of oxygen content determination is disclosed that includes means for exciting spins limited to targeted oxygen-carrier molecules, means for determining a proton transfer from oxygen-carrier molecules to imageable molecules, and means for determining an oxygenation of the oxygen-carrier molecules from a reconstructed image of the imageable molecules.

The present invention has been described in terms of the preferred embodiment, and it is recognized that equivalents, alternatives, and modifications, aside from those expressly stated, are possible and within the scope of the appending claims.

What is claimed is:

1. A magnetic resonance imaging (MRI) apparatus comprising:

an MRI system having a plurality of gradient coils positioned about a bore of a magnet to impress a polarizing magnetic field and an RF transceiver system and an RF switch controlled by a pulse module to transmit RF signals to an RF coil assembly to acquire MR images; and a computer programmed to:
cause application of a pulse sequence to excite oxygen-bearable molecules within a ROI having a change in oxygenation;
acquire MR data from directly imageable molecules having been influenced by the oxygen-bearable molecules; and
reconstruct an image from the MR data to illustrate a change in oxygen debt across the ROI.

2. The MRI apparatus of claim 1 wherein the oxygen-bearable molecules include deoxy-heme-proteins.

3. The MRI apparatus of claim 2 wherein the deoxy-heme-proteins include at least one of deoxy-hemoglobin and deoxy-myoglobin.

4. The MRI apparatus of claim 1 wherein the oxygen-bearable molecules include proximal histidine NH.

5. The MRI apparatus of claim 1 wherein the computer is further programmed to determine oxygen concentration across the ROI.

6. The MRI apparatus of claim 1 wherein the computer is further programmed to map oxygenation levels across the ROI.

7. The MRI apparatus of claim 1 wherein the RF pulse sequence is configured to excite the oxygen-bearable molecules to a saturation such that a water transfer effect excites the directly imageable molecules.

8. The apparatus of claim 1 wherein the computer is further programmed to cause the ROI to be irradiated with multiple exchangeable resonance frequencies to enhance resolution of the image.

9. The apparatus of claim 1 wherein the computer is further programmed to cause the ROI to be irradiated with multiple exchangeable resonance frequencies substantially simultaneously.

10. A method of determining oxygenation of heme-proteins in vivo comprising:
applying radio frequency (RF) energy to an imaging subject to excite off-resonance spins of water-exchangeable molecules;
determining proton transfer from excited water-exchangeable molecules to non-excited molecules;
acquiring MR data from the non-excited molecules; and
determining oxygen content of the water-exchangeable molecules from the MR data.

11. The method of claim 10 further comprising determining a concentration of at least one of deoxy-hemoglobin and deoxy-myoglobin in the imaging subject.

12. The method of claim 10 further comprising determining a spatial distribution of oxygen debt across a data acquisition region.

13. The method of claim 10 further comprising determining proton transfer from the water-exchangeable molecules to water molecules.

14. The method of claim 10 wherein applying RF energy further comprises applying off-resonance RF pulses.

15. The method of claim 10 wherein applying RF energy further comprises applying a paramagnetic hyperfine-shifted exchangeable resonance RF pulse sequence to the imaging subject.

16. A method of clinical imaging comprising:
exciting water-exchangeable spins in oxygen-bearable molecules in a region-of-interest (ROI) having a change in oxygen status;
irradiating the ROI with exchangeable resonances and wherein the exchangeable resonances are within a resonance in a proton spectrum of one of deoxy-hemoglobin and deoxy-myoglobin;
detecting proton transfer within the ROI from exchangeable protons within water; and
determining changes in oxygen levels across the ROI.

17. The method of claim 16 further comprising selectively irradiating the ROI and distinguishing water signal changes within the ROT due to deoxy-hemoglobin and or deoxy-myoglobin from background MT effects.

18. The method of claim 17 wherein the proton spectrum is within at least one of a range of approximately 10 to 80 ppm.

19. The method of claim 16 wherein exciting includes irradiating the ROI such that spins of at least one of deoxy-hemoglobin and deoxy-myoglobin is excited.

20. The method of claim 16 further comprising assessing oxygen depletion within the ROI.

21. The method of claim 16 further comprising acquiring MR imaging data from the directly imageable molecules via proton transfer to enhance contrast between oxygen-rich and oxygen-depleted tissue in the ROI.

22. The method of claim 16 further comprising acquiring spectral data to perform a spectral analysis of oxygen content within the ROI.

23. The method of claim 1 further comprising mapping the oxygen levels across the ROI.

24. A system of oxygen content determination comprising:
means for exciting spins limited to targeted oxygen-carrier molecules;
means for determining a proton transfer from the targeted oxygen-carrier molecules to imageable molecules;
means for determining a concentration of at least one of deoxy-hemoglobin and deoxy-hemoglobin in the ROI; and
means for determining oxygenation of the targeted oxygen-carrier molecules from a reconstructed image of the imageable molecules.

25. The system of claim 24 further comprising means for limiting spin excitation to proximal histidine NH molecules in an ROI.

26. The system of claim 24 further comprising means for displaying a spatial distribution of oxygen depletion across the ROI.

27. The system of claim 24 further comprising means for determining cancerous tissue presence in an ROI.

28. The system of claim 24 further comprising means for localizing oxygen depletion across an ROI.

* * * * *

UNITED STATES PATENT AND TRADEMARK OFFICE
CERTIFICATE OF CORRECTION

PATENT NO. : 6,979,999 B2
DATED : December 27, 2005
INVENTOR(S) : Hurd

It is certified that error appears in the above-identified patent and that said Letters Patent is hereby corrected as shown below:

<u>Title page,</u>
Item [57], ABSTRACT,
Line 2, delete "-bearable" and insert -- -bearing --.

<u>Column 8,</u>
Line 18, delete "ROT" and insert -- ROI --;
Line 44, delete "-hemoglobin" and insert -- -myoglobin --.

Signed and Sealed this

Fourth Day of April, 2006

JON W. DUDAS
*Director of the United States Patent and Trademark Office*